(12) United States Patent
Matsuda et al.

(10) Patent No.: US 11,219,123 B2
(45) Date of Patent: Jan. 4, 2022

(54) PRINTED CIRCUIT BOARD AND METHOD FOR MANUFACTURING SAME

(71) Applicant: NIPPON MEKTRON, LTD., Tokyo (JP)

(72) Inventors: Fumihiko Matsuda, Tokyo (JP); Yoshihiko Narisawa, Tokyo (JP); Kenji Kumagai, Tokyo (JP); Daisuke Shiokawa, Tokyo (JP); Yuki Ogi, Tokyo (JP); Akihiko Toyoshima, Tokyo (JP); Masami Uchino, Tokyo (JP); Isao Arase, Tokyo (JP); Hiroshi Takeuchi, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 17/173,102

(22) Filed: Feb. 10, 2021

(65) Prior Publication Data

US 2021/0282263 A1    Sep. 9, 2021

(30) Foreign Application Priority Data

Mar. 5, 2020    (JP) .............................. JP2020-037868

(51) Int. Cl.
*H05K 1/02* (2006.01)
*H05K 1/03* (2006.01)

(52) U.S. Cl.
CPC .......... *H05K 1/0296* (2013.01); *H05K 1/0284* (2013.01); *H05K 1/032* (2013.01); *H05K 2201/0141* (2013.01)

(58) Field of Classification Search
CPC .. H05K 1/0284; H05K 1/0296; H05K 1/0313; H05K 1/032; H05K 3/386; H05K 3/4635; H05K 2201/0195
See application file for complete search history.

(56) References Cited

U.S. PATENT DOCUMENTS

| | | | |
|---|---|---|---|
| 9,788,439 | B2 | 10/2017 | Takano et al. |
| 10,004,148 | B2 | 6/2018 | Takano et al. |
| 2007/0169960 | A1 | 7/2007 | Hayashi |
| 2012/0292085 | A1 | 11/2012 | Watanabe |
| 2015/0382460 | A1 | 12/2015 | Ajoian |
| 2016/0295707 | A1 | 10/2016 | Takano et al. |
| 2017/0367197 | A1 | 12/2017 | Takano et al. |
| 2020/0015351 | A1 | 1/2020 | Takano et al. |

FOREIGN PATENT DOCUMENTS

| | | |
|---|---|---|
| JP | 2007-096121 A | 4/2007 |
| JP | 2008-099177 A | 4/2008 |
| JP | 2011-066293 A | 3/2011 |
| JP | 2012-243923 A | 12/2012 |
| JP | 2013-041868 A | 2/2013 |

(Continued)

*Primary Examiner* — Jeremy C Norris
(74) *Attorney, Agent, or Firm* — Studebaker & Brackett PC

(57) ABSTRACT

Provided is a printed circuit board which includes: a first dielectric layer including a first principal surface and a second principal surface on a side opposite to the first principal surface; a first adhesive layer formed on the first principal surface; a first metal foil pattern formed on the first adhesive layer and forming a signal line; and a second metal foil pattern formed on the second principal surface and forming a ground layer, in which the first metal foil pattern has a higher specific conductivity than a specific conductivity of the second metal foil pattern.

13 Claims, 17 Drawing Sheets

(56) References Cited

FOREIGN PATENT DOCUMENTS

| | | |
|---|---|---|
| JP | 2014-051708 A | 3/2014 |
| JP | 2015-147978 A | 8/2015 |
| JP | 2019-106508 A | 6/2019 |
| TW | 200529724 A | 9/2005 |
| TW | 200934345 A | 8/2009 |
| TW | 201528898 A | 7/2015 |

FIG. 5A1
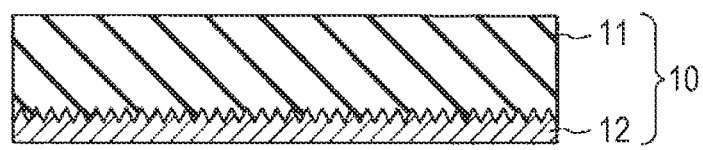
FIG. 5A2
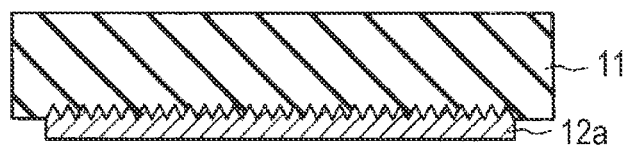
FIG. 5A3
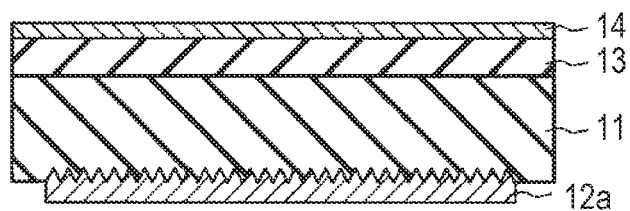

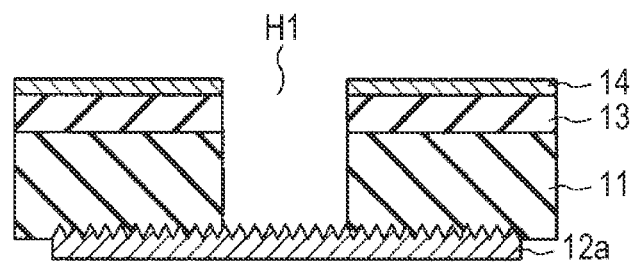
FIG. 5B1
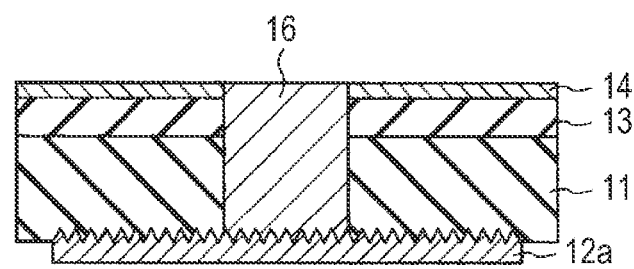
FIG. 5B2
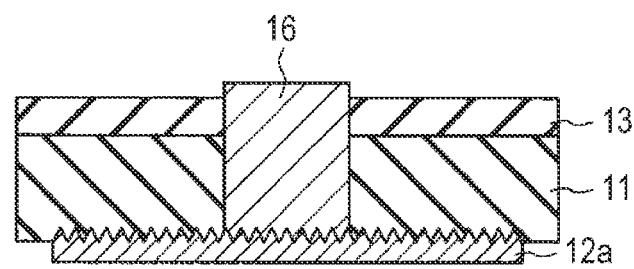
FIG. 5B3

FIG. 5C1
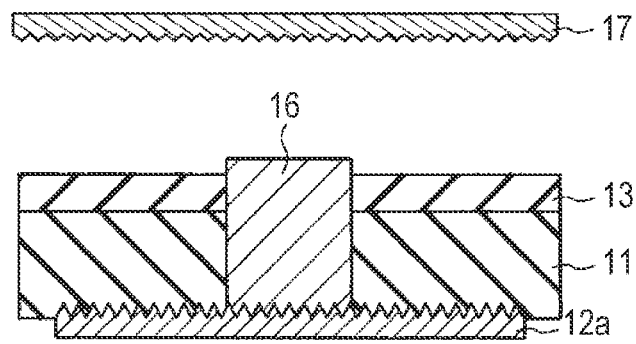
FIG. 5C2
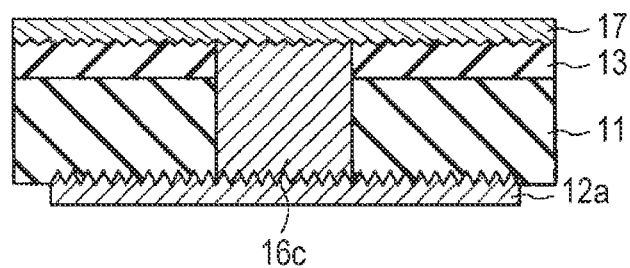
FIG. 5C3
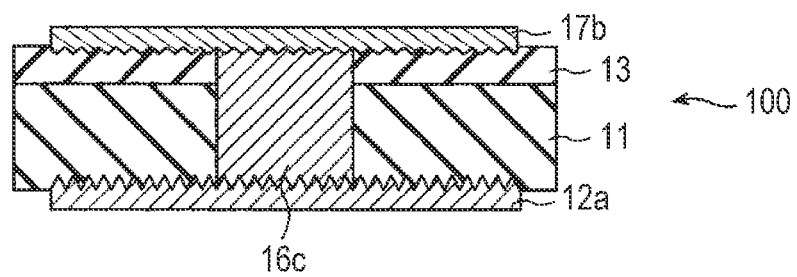

FIG. 6A1
FIG. 6A2
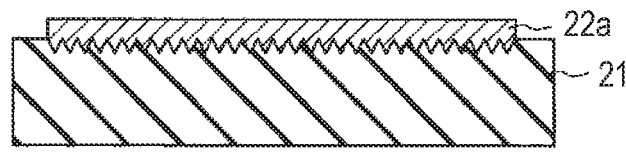
FIG. 6A3
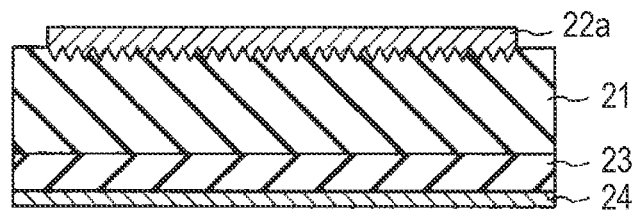

*FIG. 6B1*
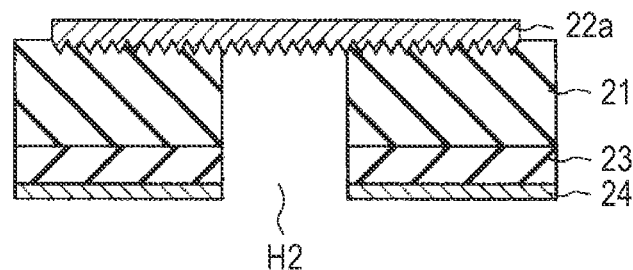
*FIG. 6B2*
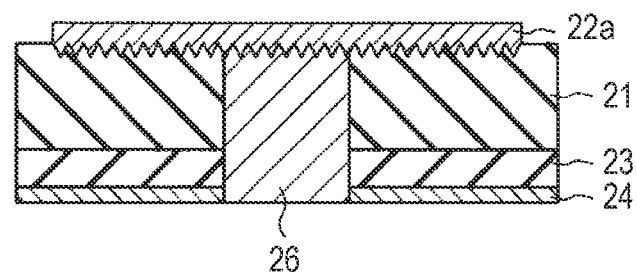
*FIG. 6B3*
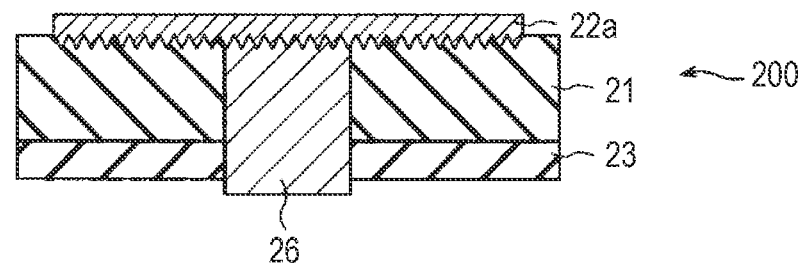

FIG. 10A1
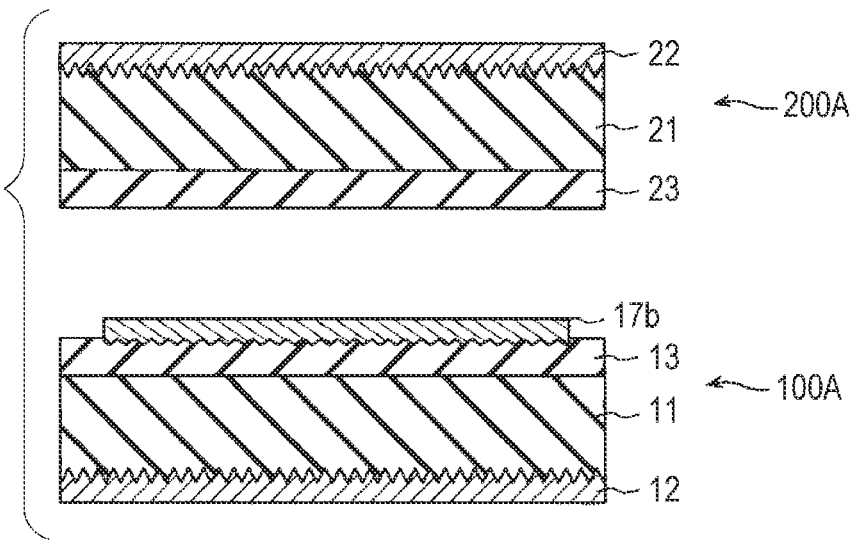
FIG. 10A2
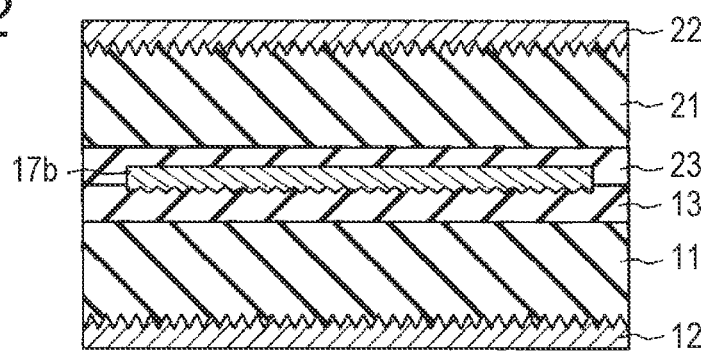

FIG. 10B1
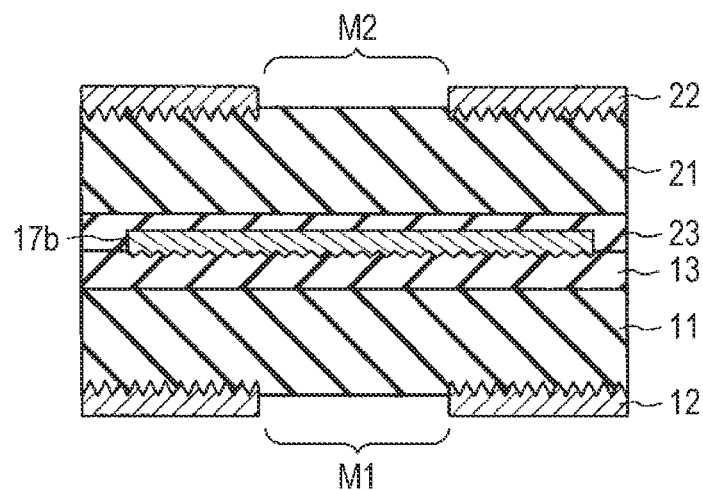
FIG. 10B2
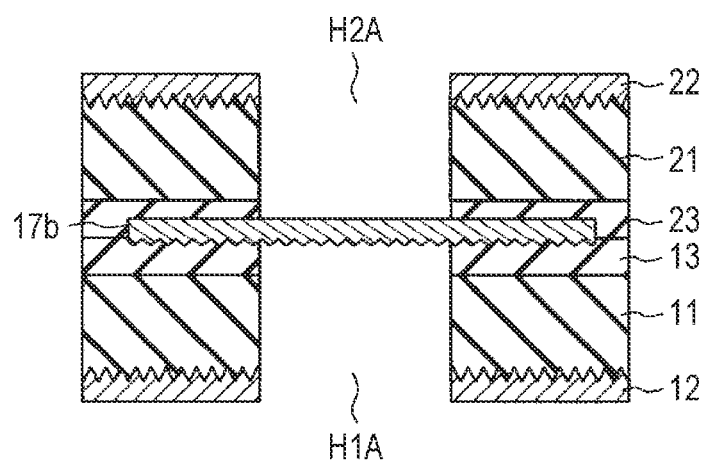

FIG. 10C1
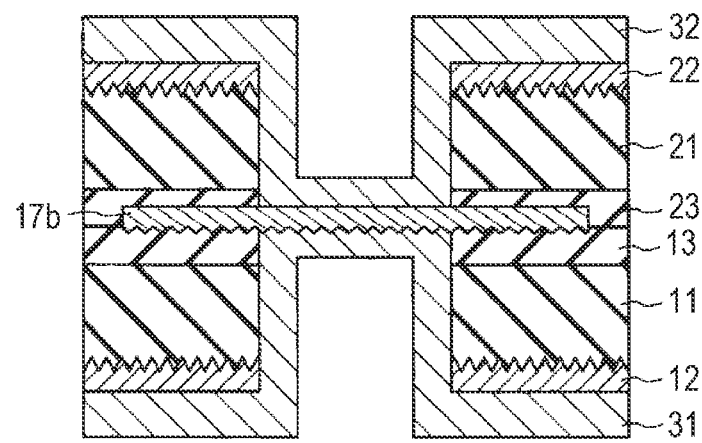
FIG. 10C2
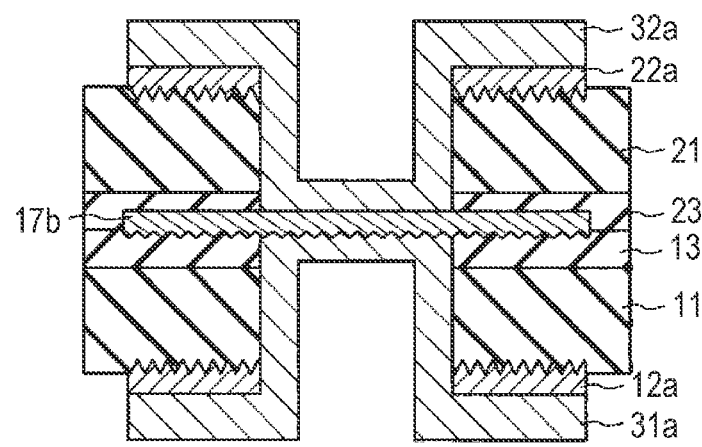

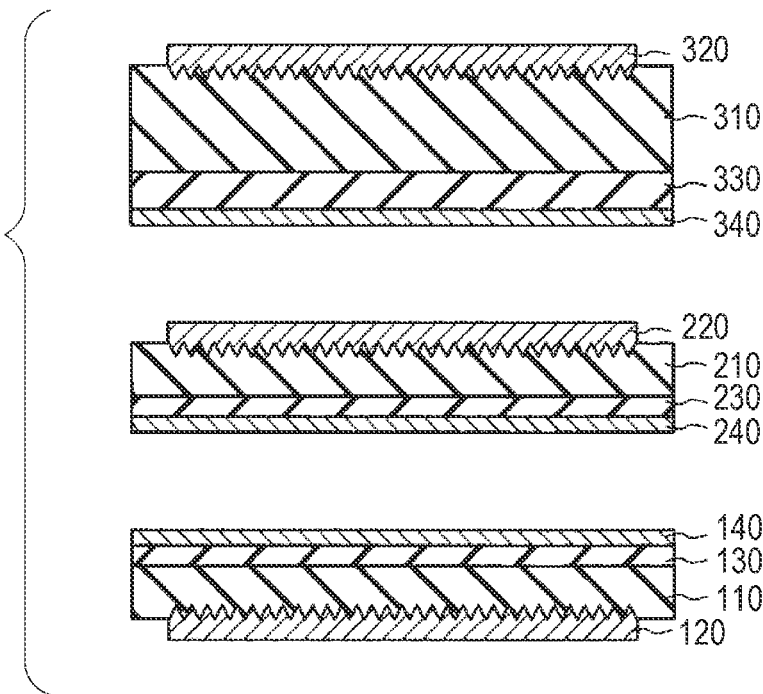
FIG. 11A1
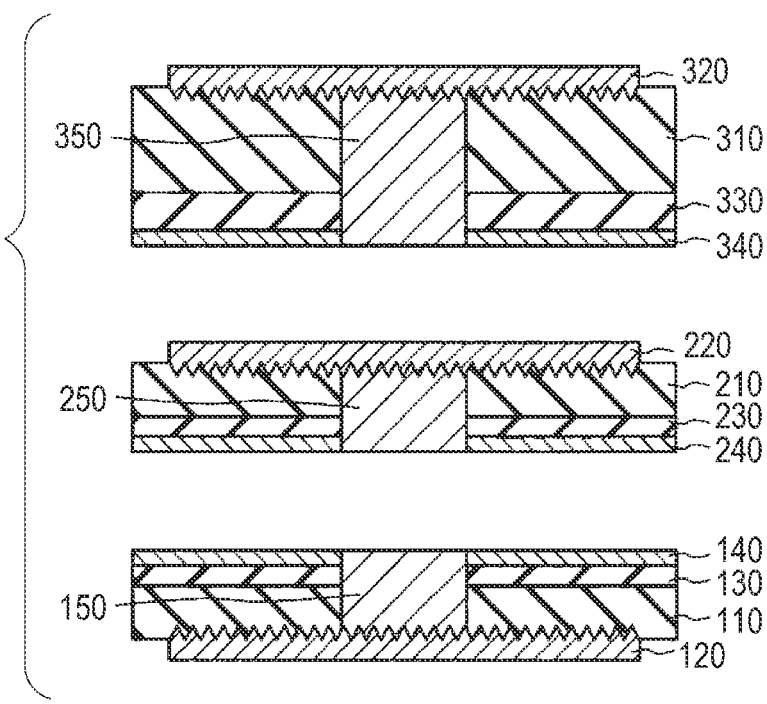
FIG. 11A2

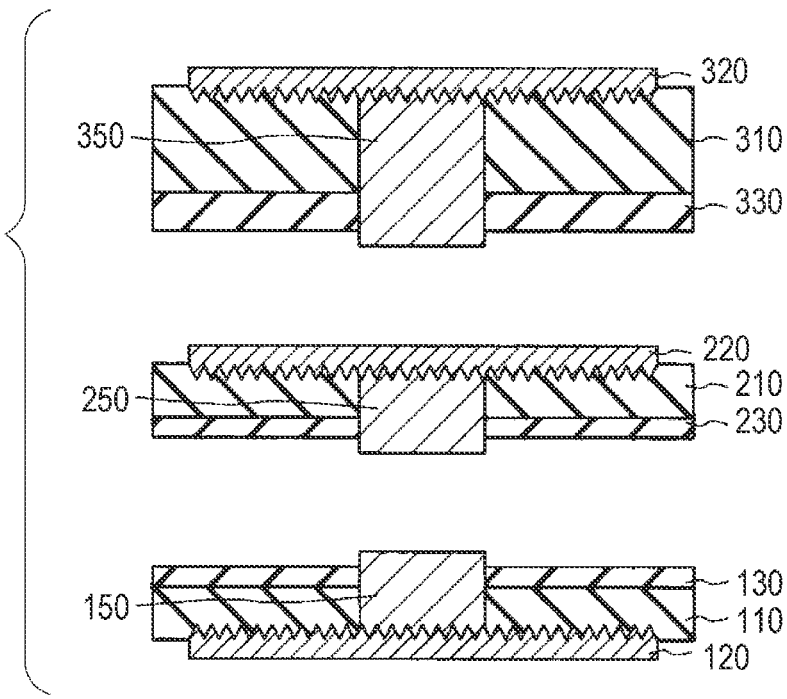
FIG. 11B1
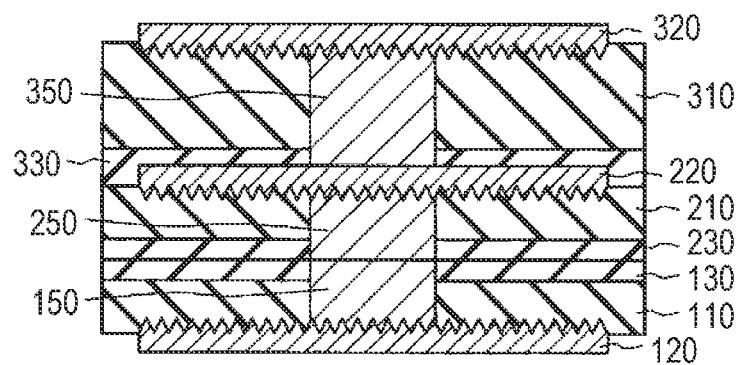
FIG. 11B2

PRINTED CIRCUIT BOARD AND METHOD FOR MANUFACTURING SAME

CROSS-REFERENCE TO RELATED APPLICATION

This application claims priority from Japanese Patent Application No. 2020-037868 filed with the Japan Patent Office on Mar. 5, 2020, the entire content of which is hereby incorporated by reference.

BACKGROUND

1. Technical Field

The present disclosure relates to a printed circuit board and the method for manufacturing the printed circuit board.

2. Related Art

With development of smaller higher-speed electronic equipment such as a smartphone, a laptop computer, a digital camera, and a game machine, the amount of information processed by the electronic equipment has been rapidly increased in recent years. For this reason, tendency shows that a signal transmission speed of a printed circuit board for transmitting a high-frequency signal is increased. For example, transition of a mobile communication terminal such as a smartphone to a next-generation communication standard 5G has been started from 2019. According to the 5G standard, a signal with a frequency of several GHz to 20 to 30 GHz is used. Further, around 2022, it is expected that the frequency of the signal transmitted/received by the communication terminal is increased to about 50 GHz.

Generally, a signal transmission loss increases as the frequency increases. For this reason, reduction in the transmission loss in a signal line has been increasingly important.

For reducing the signal transmission loss, it has been demanded to use a material having excellent dielectric properties including a permittivity and a dissipation factor for a dielectric layer of the printed circuit board. For example, JP-A-2011-66293 and JP-A-2007-96121 describe printed circuit boards to which liquid crystal polymer (LCP) is applied.

SUMMARY

A printed circuit board according to an embodiment of the present disclosure includes: a first dielectric layer including a first principal surface and a second principal surface on a side opposite to the first principal surface; a first adhesive layer formed on the first principal surface; a first metal foil pattern formed on the first adhesive layer and forming a signal line; and a second metal foil pattern formed on the second principal surface and forming a ground layer, in which the first metal foil pattern has a higher specific conductivity than a specific conductivity of the second metal foil pattern.

BRIEF DESCRIPTION OF DRAWINGS

FIGS. 5A1, 5A2, and 5A3 are sectional views for describing steps in the method for manufacturing a wiring base material of the printed circuit board according to the present embodiment;

FIGS. 5B1, 5B2, and 5B3 are sectional views for describing steps after FIG. 5A3 in the method for manufacturing the wiring base material of the printed circuit board according to the present embodiment;

FIGS. 5C1, 5C2, and 5C3 are sectional views for describing steps after FIG. 5B3 in the method for manufacturing the wiring base material of the printed circuit board according to the present embodiment;

FIGS. 6A1, 6A2, and 6A3 are sectional views for describing steps in the method for manufacturing a wiring base material of the printed circuit board according to the present embodiment;

FIGS. 6B1, 6B2, and 6B3 are sectional views for describing steps after FIG. 6A3 in the method for manufacturing the wiring base material of the printed circuit board according to the present embodiment;

FIGS. 10A1 and 10A2 are sectional views for describing a stacking step for the printed circuit board according to the variation of the present embodiment;

FIGS. 10B1 and 10B2 are sectional views for describing a punching step after FIG. 10A2 for the printed circuit board according to the variation of the present embodiment;

FIGS. 10C1 and 10C2 are sectional views for describing an interlayer connection step after FIG. 10B2 for the printed circuit board according to the variation of the present embodiment;

FIGS. 11A1 and 11A2 are sectional views for describing steps in the method for manufacturing a printed circuit board according to a comparative example; and FIGS. 11B1 and 11B2 are sectional views for describing steps after FIG. 11A2 in the method for manufacturing the printed circuit board according to the comparative example.

DETAILED DESCRIPTION

Figure 1:
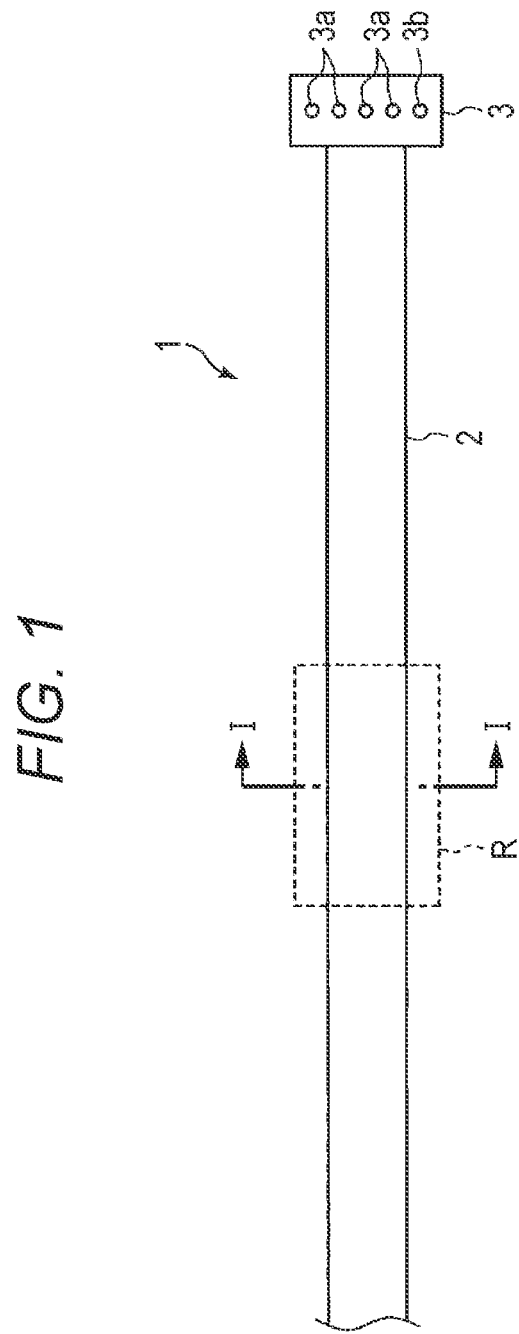
FIG. 1 is a plan view of a high-frequency signal transmission component according to the present embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The method for manufacturing the printed circuit board according to the above-described comparative example will be described with reference to FIGS. 11A1, 11A2, 11B1, and 11B2. In this method, three one-side copper-clad laminates are used to produce the printed circuit board having a three-layer stripline structure.

As illustrated in FIG. 11A1, three wiring base materials (a lower side, the center, an upper side) are prepared. The lower wiring base material is configured such that an adhesive layer 130 and a protective film 140 are sequentially stacked on a resin surface of the one-side copper-clad laminate including a dielectric layer 110 and copper foil 120 bonded to each other. In the center wiring based material, an adhesive layer 230 and a protective film 240 are stacked in this order on a resin surface of the one-side copper-clad laminate including a dielectric layer 210 and copper foil 220 bonded to each other. In the upper wiring base material, an adhesive layer 330 and a protective film 340 are stacked in this order on a resin surface of the one-side copper-clad laminate including a dielectric layer 310 and copper foil 320 bonded to each other. Note that for ensuring the strength of adhesion between the copper foil 120, 220, 320 and the dielectric layer 110, 210, 310, a back surface of each copper foil is roughened. Moreover, by a well-known fabrication method, the copper foil 120, 320 is patterned to have a ground layer. Similarly, the copper foil 220 is patterned to have a signal line layer and a ground wire layer.

Figure 2:
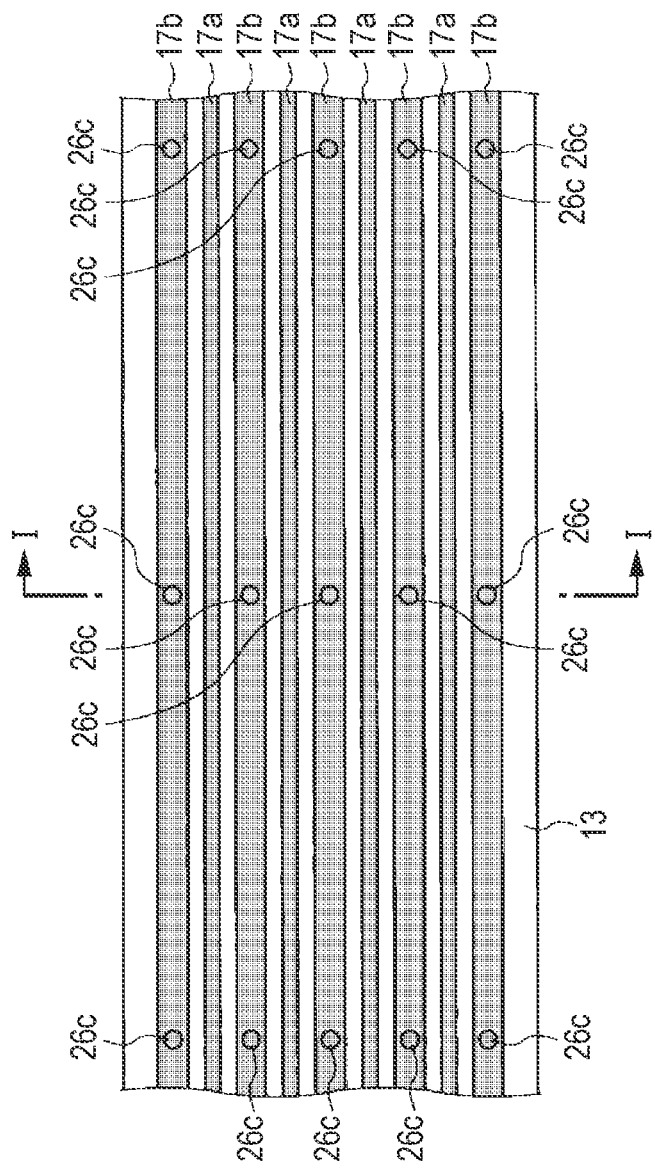
FIG. 2 is a plan view of signal lines and ground wires of an inner layer in a region R of a printed circuit board according to the present embodiment.

Next, as illustrated in FIG. 11A2, a predetermined portion of each of three wiring base materials described above is filled with conductive paste 150, 250, 350. Specifically, a conductive hole is formed at a predetermined location of the wiring base material by laser machining. Then, screen printing is performed using the protective films 140, 240, 340 as masks, and in this manner, the conductive hole is filled with the conductive paste.

Next, as illustrated in FIG. 11B1, the protective film 140, 240, 340 is detached from each wiring base material. In this manner, a top portion of the conductive paste 150, 250, 350 with which the conductive hole is filled protrudes.

Next, as illustrated in FIG. 11B2, three wiring base materials are stacked on each other after position adjustment, thereby forming a laminated body. Thereafter, the laminated body is integrated by heating and pressurization. In this manner, the printed circuit board having the three-layer stripline structure is obtained.

In the printed circuit board manufactured by the method according to the above-described comparative example, the back surface of the copper foil 220 is roughened. Thus, due to a skin effect, it is difficult to reduce a loss of transmission of a high-frequency signal flowing on the back surface of the copper foil 220.

It has been expected that the transmission loss is reduced using the liquid crystal polymer for the dielectric layer as described above. However, even if the copper foil is directly pressure-bonded to the liquid crystal polymer, it is difficult to obtain sufficient adhesion strength. For this reason, roughening treatment needs to be performed for the surface of the copper foil. Alternatively, a back surface treatment film containing magnetic metal such as nickel needs to be provided. This back surface treatment film is also a cause for an increase in the transmission loss due to the skin effect.

Moreover, as illustrated in FIG. 11B2, the printed circuit board according to the comparative example has an asymmetrical structure in a thickness direction. For this reason, when the printed circuit board is bent for assembly into a housing of the electronic equipment or when the bent printed circuit board is placed in the housing, great stress is on the signal line. For this reason, there is a probability that breaking of the signal line or degradation of transmission properties is caused.

For these reasons, a first object of the present disclosure is to provide a printed circuit board configured so that a high-frequency signal transmission loss can be reduced and the method for manufacturing the printed circuit board.

Moreover, a second object of the present disclosure is to provide a printed circuit board configured so that application of great stress on a signal line can be reduced even if the printed circuit board is bent and the method for manufacturing the printed circuit board.

A printed circuit board according to a first aspect of the present disclosure includes: a first dielectric layer including a first principal surface and a second principal surface on a side opposite to the first principal surface; a first adhesive layer formed on the first principal surface; a first metal foil pattern formed on the first adhesive layer and forming a signal line; and a second metal foil pattern formed on the second principal surface and forming a ground layer, in which the first metal foil pattern has a higher specific conductivity than a specific conductivity of the second metal foil pattern.

Further, in the printed circuit board, the first dielectric layer may be made of liquid crystal polymer.

Moreover, in the printed circuit board, there may be provided: a second dielectric layer including a third principal surface and a fourth principal surface on a side opposite to the third principal surface; a second adhesive layer formed on the fourth principal surface and bonded to the first adhesive layer; and a third metal foil pattern formed on the third principal surface and forming a ground layer, and the first metal foil pattern may have a higher specific conductivity than a specific conductivity of the third metal foil pattern.

In addition, in the printed circuit board, the second adhesive layer may be thicker than the first metal foil pattern, and the first metal foil pattern may be embedded in an adhesive layer including the first adhesive layer and the second adhesive layer.

Further, in the printed circuit board, the first dielectric layer and the second dielectric layer may have an identical thickness, and the first adhesive layer and the second adhesive layer may have an identical thickness.

Still further, in the printed circuit board, the first dielectric layer and the second dielectric layer may have an identical thickness, and the first adhesive layer may be thinner than the second adhesive layer by a thickness of the first metal foil pattern.

Moreover, in the printed circuit board, the second dielectric layer may be made of liquid crystal polymer.

In addition, in the printed circuit board, the first metal foil pattern may have a lower surface roughness and/or contain a smaller magnetic metal amount than those of the second metal foil pattern and the third metal foil pattern.

Further, in the printed circuit board, a ten-point average roughness of the first metal foil pattern may be equal to or lower than 1.0 μm.

Still further, in the printed circuit board, a fourth metal foil pattern formed on the first adhesive layer, extending in parallel with the signal line of the first metal foil pattern with a predetermined spacing from the signal line of the first metal foil pattern, and forming a ground wire, a first ground connection portion electrically connecting the second metal foil pattern and the fourth metal foil pattern, and a second ground connection portion electrically connecting the third metal foil pattern and the fourth metal foil pattern may further be provided.

A printed circuit board according to a second aspect of the present disclosure includes: a first dielectric layer including a first principal surface and a second principal surface on a side opposite to the first principal surface; a first adhesive layer formed on the first principal surface; a first metal foil pattern formed on the first adhesive layer and forming a signal line; a second metal foil pattern formed on the second principal surface and forming a ground layer; a second dielectric layer including a third principal surface and a fourth principal surface on a side opposite to the third principal surface; a second adhesive layer formed on the fourth principal surface and bonded to the first adhesive layer; and a third metal foil pattern formed on the third principal surface and forming a ground layer. The second adhesive layer is thicker than the first metal foil pattern, and the first metal foil pattern is embedded in an adhesive layer including the first adhesive layer and the second adhesive layer.

A method for manufacturing a printed circuit board according to the first aspect of the present disclosure includes: preparing a first one-side metal-clad laminate including a first dielectric layer having a first principal surface and a second principal surface on a side opposite to the first principal surface and first metal foil provided on the second principal surface; removing, by irradiation of a predetermined location of a first protective film stacked on the first principal surface through a first adhesive layer with laser light, the first protective film, the first adhesive layer, and the first dielectric layer to form a first conductive hole such that the first metal foil is exposed at a bottom surface of the first conductive hole; filling the first conductive hole with first conductive paste; detaching the first protective film from the first adhesive layer; a laminate step of bonding, onto the first adhesive layer, second metal foil having a lower specific conductivity than a specific conductivity of the first metal foil; and forming, by patterning of the second metal foil, a metal foil pattern forming a signal line and a metal foil pattern forming a ground wire.

A method for manufacturing a printed circuit board according to the second aspect of the present disclosure includes: preparing a first one-side metal-clad laminate including a first dielectric layer having a first principal surface and a second principal surface on a side opposite to the first principal surface and first metal foil provided on the second principal surface; removing, by irradiation of a predetermined location of a first protective film stacked on the first principal surface through a first adhesive layer with laser light, the first protective film, the first adhesive layer, and the first dielectric layer to form a first conductive hole such that the first metal foil is exposed at a bottom surface of the first conductive hole; filling the first conductive hole with first conductive paste; detaching the first protective film from the first adhesive layer; a laminate step of bonding, onto the first adhesive layer, second metal foil having a lower specific conductivity than a specific conductivity of the first metal foil; forming, by patterning of the second metal foil, a metal foil pattern forming a signal line and a metal foil pattern forming a ground wire to obtain a first wiring base material; preparing a second one-side metal-clad laminate including a second dielectric layer having a third principal surface and a fourth principal surface on a side opposite to the third principal surface and third metal foil provided on the third principal surface; removing, by irradiation of a predetermined location of a second protective film stacked on the fourth principal surface through a second adhesive layer with laser light, the second protective film, the second adhesive layer, and the second dielectric layer to form a second conductive hole such that the third metal foil is exposed at a bottom surface of the second conductive hole; a step of filling the second conductive hole with second conductive paste; detaching the second protective film from the second adhesive layer to obtain a second wiring base material; stacking the second wiring base material on the first wiring base material such that the second conductive paste protruding from the second adhesive layer contacts the metal foil pattern of the ground wire; and integrating, by heating and pressurization, the first wiring base material and the second wiring base material stacked on each other.

A method for manufacturing a printed circuit board according to a third aspect of the present disclosure includes: preparing a one-side metal-clad laminate including a dielectric layer having a first principal surface and a second principal surface on a side opposite to the first principal surface and first metal foil provided on the second principal surface; stacking an adhesive layer on the first principal surface; a laminate step of bonding, onto the adhesive layer, second metal foil having a lower specific conductivity than a specific conductivity of the first metal foil; forming, by patterning of the second metal foil, a metal foil pattern forming a signal line and a metal foil pattern forming a ground wire; forming a conformal mask by patterning of the first metal foil; removing the dielectric layer and the adhesive layer by irradiation of the conformal mask with laser light to form a conductive hole such that the metal foil pattern of the ground wire is exposed at a bottom surface of the conductive hole; and forming a metal plating layer inside the conductive hole such that the metal foil pattern of the ground wire and the first metal foil are electrically connected to each other.

A method for manufacturing a printed circuit board according to a fourth aspect of the present disclosure includes: preparing a first one-side metal-clad laminate including a first dielectric layer having a first principal surface and a second principal surface on a side opposite to the first principal surface and first metal foil provided on the second principal surface; stacking a first adhesive layer on the first principal surface; a laminate step of bonding, onto the first adhesive layer, second metal foil having a lower specific conductivity than a specific conductivity of the first metal foil; forming, by patterning of the second metal foil, a metal foil pattern forming a signal line and a metal foil pattern forming a ground wire to obtain a first wiring base material; preparing a second one-side metal-clad laminate including a second dielectric layer having a third principal surface and a fourth principal surface on a side opposite to the third principal surface and third metal foil provided on the third principal surface; stacking a second adhesive layer on the fourth principal surface to obtain a second wiring base material; stacking the first wiring base material and the second wiring base material such that the first adhesive layer and the second adhesive layer face each other; integrating, by heating and pressurization, the first wiring base material and the second wiring base material stacked on each other; forming a first conformal mask by patterning of the first metal foil; forming a second conformal mask by patterning of the third metal foil; removing the first dielectric layer and the first adhesive layer by irradiation of the first conformal mask with laser light to form a first conductive hole such that the metal foil pattern of the ground wire is exposed at a bottom surface of the first conductive hole; removing the second dielectric layer and the second adhesive layer by irradiation of the second conformal mask with laser light to form a second conductive hole such that the metal foil pattern of the ground wire is exposed at a bottom surface of the second conductive hole; forming a metal plating layer inside the first conductive hole such that the metal foil pattern of the ground wire and the first metal foil are electrically connected to each other; and forming a metal plating layer inside the second conductive hole such that the metal foil pattern of the ground wire and the third metal foil are electrically connected to each other.

Hereinafter, an embodiment according to the present disclosure will be described with reference to the schematic drawings. In each figure, the same reference numerals are used to represent components having equivalent functions. A relationship (an aspect ratio) between a thickness and a planar dimension, the ratio of the thickness of each layer and the like as illustrated in the drawings are not necessarily coincident with actual ratios.

<High-Frequency Signal Transmission Component 1>

First, a high-frequency signal transmission component 1 according to the present embodiment will be described with reference to FIG. 1. FIG. 1 illustrates a plan view of the high-frequency signal transmission component 1. The high-frequency signal transmission component 1 is provided in a housing of an information processing terminal including a smartphone and a tablet terminal. The high-frequency signal transmission component 1 electrically connects an antenna configured to transmit or receive a wireless signal and a main board on which a signal processing chip is mounted.

As illustrated in FIG. 1, the high-frequency signal transmission component 1 includes a printed circuit board 2 forming an elongated band-shaped cable portion and a connector 3 provided at an end portion of the printed circuit board 2.

Figure 3:
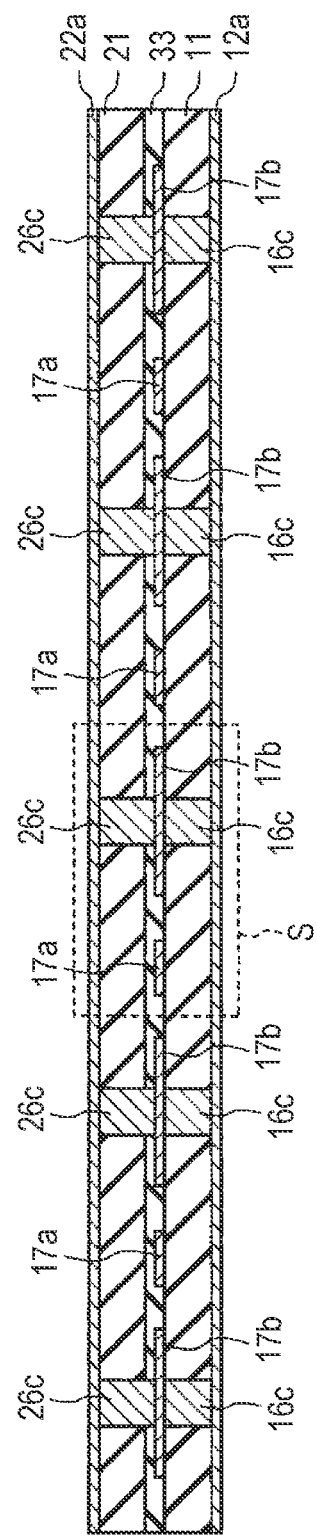
FIG. 3 is a sectional view of the printed circuit board along an I-I line of FIGS. 1 and 2.

The printed circuit board 2 is a flexible printed circuit board (FPC) having flexibility, and has a three-layer stripline structure (see FIG. 3). As illustrated in FIG. 2, in the printed circuit board 2, metal foil patterns 17a forming signal lines and metal foil patterns 17b forming ground wires form a wiring pattern of an inner layer. In this wiring pattern, the metal foil patterns 17a and the ground wires arranged alternately extend in a longitudinal direction. For example, a high-frequency signal of several GHz to several tens of GHz is input to these signal lines. Note that the number of signal lines is not limited to that illustrated in the figure.

The connector 3 is provided at the end portion of the printed circuit board 2, and is electrically connected to the main board or the antenna, for example. The connector 3 has connection pins 3a electrically connected to the metal foil patterns 17a as the signal lines and a connection pin 3b electrically connected to the metal foil patterns 17b as the ground wires.

Note that the signal line of the printed circuit board may be provided as a differential line. In this case, two provided signal lines extend in parallel with no ground wire being sandwiched therebetween. Alternatively, multiple pairs of differential lines may be provided through the ground wires. Alternatively, transmission lines and differential lines with a single end structure may be mixed.

The planar shape of the metal foil pattern 17a, 17b as the signal line or the ground wire is not limited to a linear shape as illustrated in FIG. 2. For example, the planar shape may be a shape as described in JP-A-2019-106508.

<Printed Circuit Board 2>

Figure 4:
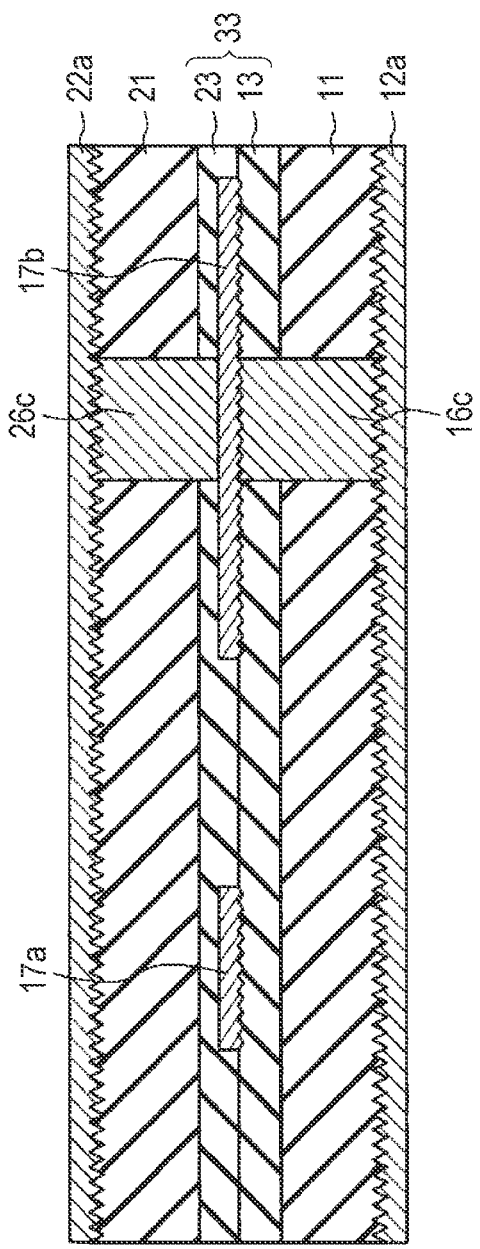
FIG. 4 is an enlarged view of a region S of FIG. 3.

Next, the printed circuit board 2 will be described in more detail with reference to FIGS. 3 and 4. FIG. 3 illustrates a sectional view of the printed circuit board 2 along an I-I line of FIGS. 1 and 2. FIG. 4 is an enlarged view of a region S of FIG. 3.

As illustrated in FIG. 3, the printed circuit board 2 includes dielectric layers 11, 21, the multiple metal foil patterns (signal lines) 17a, the multiple metal foil patterns (ground wires) 17b, metal foil patterns 12a, 22a forming ground layers, filled vias 16c, 26c, and an adhesive layer 33.

Note that although not shown in the figure, the metal foil patterns 12a, 22a as outer layers may be covered with insulating protective films.

More specifically, the printed circuit board 2 includes, as seen from FIG. 4, the dielectric layer 11, an adhesive layer 13 formed on an upper surface (a first principal surface) of the dielectric layer 11, the metal foil patterns 17a, 17b formed on the adhesive layer 13, the metal foil pattern 12a formed on a lower surface (a second principal surface) of the dielectric layer 11, the dielectric layer 21, the metal foil pattern 22a formed on an upper surface (a third principal surface) of the dielectric layer 21, an adhesive layer 23 formed on a lower surface (a fourth principal surface) of the dielectric layer 21, and the filled vias 16c, 26c as interlayer conductive paths.

Any of the dielectric layer 11 and the dielectric layer 21 is an insulating resin film having flexibility, and has the upper surface and the lower surface on a side opposite to the upper surface. In the present embodiment, the dielectric layer 11 and the dielectric layer 21 have the same thickness (e.g., 100 µm each). Moreover, in the present embodiment, the dielectric layers 11, 21 are made of liquid crystal polymer as one of materials having the lowest permittivity and dissipation factor.

Note that the material of the dielectric layers 11, 21 is not limited to the LCP. The material may be other insulating materials (polyimide, fluorine-based resin and the like).

In the present embodiment, each of the dielectric layer 11 and the dielectric layer 21 includes a single layer. Note that at least any one of the dielectric layer 11 or the dielectric layer 21 may include a stack of multiple films. In this case, the materials of the multiple films may be the same as each other or different from each other.

As illustrated in FIG. 4, the adhesive layer 13 and the adhesive layer 23 are bonded to each other to form the single adhesive layer 33. The adhesive layer 23 described herein is thicker than the metal foil pattern 17a. The metal foil patterns 17a, 17b are embedded in the adhesive layer 33. As described above, the metal foil patterns 17a as the signal lines are embedded in the adhesive layer 33. With this configuration, mechanical stability of the signal line is easily maintained even in a case where the printed circuit board 2 is bent. Thus, degradation of transmission quality can be reduced.

In the present embodiment, the adhesive layers 13, 23 have dielectric properties equal to or less than those of the dielectric layers 11, 21. Note that as the adhesive layers 13, 23, adhesive layers having better dielectric properties than those of the dielectric layers 11, 21 may be used.

The metal foil patterns 17a, 17b adhere to the dielectric layer 11 through the adhesive layer 13. The metal foil patterns 17a form the signal lines. Moreover, the metal foil patterns 17b form the ground wires.

The metal foil patterns 17a, 17b are formed by patterning of a single sheet of metal foil. Details will be described later in a section regarding the method for manufacturing the printed circuit board. The metal foil patterns 17a, 17b are formed in such a manner that metal foil (e.g., copper foil) bonded onto the adhesive layer 13 is patterned. Thus, the metal foil patterns 17a can be formed using the type of metal foil (e.g., low-roughness copper foil with no rough surface) not providing sufficient adhesion strength between the metal foil and the dielectric layer 11 such as the LCP. On the other hand, the metal foil patterns 12a, 22a are formed by patterning of metal foil (e.g., high-roughness copper foil) of a one-side metal-clad laminate.

The filled vias 16c, 26c are the interlayer conductive paths electrically connecting the ground wires (the metal foil patterns 17b) of the inner layer and the ground layers (the metal foil patterns 12a, 22a) of the outer layers. The filled via 16c electrically connects the metal foil pattern 17b and the metal foil pattern 12a. The filled via 26c electrically connects the metal foil pattern 17b and the metal foil pattern 22a. As described later in detail, the filled vias 16c, 26c are formed in such a manner that conductive paste with which through-holes penetrating the dielectric layers 11, 21 in a thickness direction are filled is hardened.

As described above, the filled via is used as an interlayer connection portion (a ground connection portion) between the ground layer of the outer layer and the ground wire of the inner layer. With this configuration, the liquid crystal polymer having a higher coefficient of thermal expansion in the thickness direction than that of a typical insulating material such as polyimide can be applied to the dielectric layer. In this case, sufficient connection reliability under, e.g., a temperature cycle can be ensured.

The properties of the metal foil pattern 17a (17b) will be described herein in more detail.

The metal foil pattern 17a has a higher specific conductivity than those of the metal foil pattern 12a and the metal foil pattern 22a. The specific conductivity ($\sigma_r$) described herein indicates a conductivity at a predetermined frequency with respect to an ideal metal surface conductivity. The specific conductivity ($\sigma_r$) is calculated according to Expression (1).

$$\sigma_r = \frac{\pi \mu_0 f_0}{\sigma_0 R_s^2} \quad (1)$$

In this expression, to is a vacuum permeability, $f_0$ is a resonant frequency, $\sigma_0$ is the conductivity of universal standard annealed copper ($58 \times 10^6$ S/m), and $R_s$ is a surface resistance.

The resonance frequency $f_0$ is a resonance frequency of a $TE_{01\delta}$ mode of a microwave integrated circuits (MIC) dielectric rod resonator (see, e.g., http://sumtec.biz/whatis-_rod.html). The surface resistance $R_s$ is a surface resistance obtained by a two-dielectric-resonator method. The surface resistance $R_s$ is measured by a method set according to a standard such as JIS H7307 (2005) or IEC61788-7 (2002).

The value of the above-described specific conductivity increases as the surface roughness (roughness) of the metal foil such as the copper foil decreases. Moreover, the value of the specific conductivity decreases as high-permeability magnetic metal (nickel or the like) contained in the metal foil increases. For example, for enhancing adhesion strength between the copper foil and a dielectric body, a back surface treatment film containing nickel and cobalt is provided on a back surface of the copper foil subjected to surface roughening. In this case, the specific conductivity of the copper foil is low. In a case where such a back surface treatment film is present, there is interference with high-frequency transmission.

In the present embodiment, as schematically illustrated in FIG. 4, the surface roughness of a back surface (a surface contacting the adhesive layer 13) of the metal foil pattern 17a is lower than the surface roughness of a back surface (i.e., a surface contacting the dielectric layer 11, 21) of the metal foil pattern 12a, 22a. Thus, a loss of transmission of the high-frequency signal flowing in the metal foil pattern 17a can be reduced (specific numerical values will be described later with reference to Table 1).

The surface roughness described herein is the roughness of the metal foil surface subjected to surface roughening for the purpose of, e.g., obtaining an anchor effect. The surface roughness is, for example, a ten-point average roughness (Rzjis) set according to a standard such as JIS B 0601-2001 or ISO 4287-1997. The ten-point average roughness of the metal foil pattern 17a is preferably equal to or lower than 1.0 μm. With this configuration, a loss of transmission of a high-frequency signal of equal to or higher than 20 GHz can be greatly reduced as shown in Table 1 described later.

Note that the metal foil pattern 17a may have a smaller magnetic metal (Ni, Co or the like.) content than those of the metal foil patterns 12a, 22a. For example, the back surface treatment film is not necessarily provided on the back surface of the metal foil pattern 17a. On the other hand, the back surface treatment films are provided on the back surfaces of the metal foil patterns 12a, 22a for enhancing the strength of adhesion to the dielectric layers 11, 21. As described above, the magnetic metal content of the metal foil pattern 17a is smaller than those of the metal foil patterns 12a, 22a. In this case, the loss of transmission of the high-frequency signal flowing in the metal foil pattern 17a can be also reduced.

<Features and Advantages Effects>

As described above, in the printed circuit board 2 according to the present embodiment, the specific conductivity of the metal foil pattern 17a is higher than the specific conductivities of the metal foil pattern 12a and the metal foil pattern 22a. On the other hand, in the comparative example, the specific conductivity of the metal foil pattern 17a is the same as the specific conductivities of the metal foil patterns 12a, 22a. Thus, as compared to the comparative example, the printed circuit board 2 according to the present embodiment can further reduce the loss of transmission of the high-frequency signal flowing in the metal foil pattern 17a.

The surface roughness of the metal foil pattern 12a, 22a is high. Thus, even in a case where the dielectric layers 11, 21 are soft less-adhesive resin materials such as the liquid crystal polymer, metal foil with a high adhesion strength can be applied. Thus, the printed circuit board resistant to bending can be provided.

In the printed circuit board 2 according to the present embodiment, the thicknesses of the dielectric layer 11 and the dielectric layer 21 are substantially the same as each other. Further, the thicknesses of the adhesive layer 13 and the adhesive layer 23 are also substantially the same as each other. Thus, as illustrated in FIGS. 3 and 4, the printed circuit board 2 is formed with a structure substantially symmetrical with respect to the metal foil pattern 17a (the signal line) in the thickness direction. Thus, when the printed circuit board 2 is bent for assembling the high-frequency signal transmission component 1 into a housing of electronic equipment, stress on the metal foil patterns (signal lines) 17a can be reduced. As a result, a failure such as breaking of the signal line can be prevented. In addition, favorable signal propagation properties can be ensured.

Note that for further enhancing the symmetry of the printed circuit board 2, the thickness of the adhesive layer 13 may be smaller than that of the adhesive layer 23 by the thickness of the metal foil pattern 17a. With this configuration, a distance from a front surface (an upper surface) of the metal foil pattern 17a to the metal foil pattern 22a and a distance from the back surface (a lower surface) of the metal foil pattern 17a to the metal foil pattern 12a are equal to each other. As a result, the stress on the metal foil patterns 17a when the printed circuit board 2 is bent can be further reduced.

In the printed circuit board 2 of the present embodiment, the ground layers are provided on both sides of the signal line. Note that the present invention is not limited to such a configuration, and the ground layer may be provided only on one side in the printed circuit board of the present embodiment. The printed circuit board including the ground layer provided only on one side has a configuration formed by excluding the dielectric layer 21, the metal foil pattern 22a, the adhesive layer 23, and the filled vias 26c from the configuration illustrated in FIG. 4.

<Method for Manufacturing Printed Circuit Board 2>

Next, one example of the method for manufacturing the printed circuit board 2 according to the embodiment will be described with reference to FIGS. 5A1 to 7B2. Note that FIGS. 5A1 to 7B2 illustrate the region S illustrated in FIG. 4 around the ground wire (the metal foil pattern 17b).

First, as illustrated in FIG. 5A1, a one-side metal-clad laminate 10 having the dielectric layer 11 and metal foil 12 provided on one surface of the dielectric layer 11 is prepared. The dielectric layer 11 is, for example, a liquid crystal polymer film with a thickness of 100 µm. The metal foil 12 is, for example, copper foil with a thickness of 12 µm. Note that the metal foil 12 may be made of metal (silver, aluminum or the like) other than copper.

Next, as illustrated in FIG. 5A2, the metal foil 12 of the one-side metal-clad laminate 10 is patterned by a well-known photofabrication method, and in this manner, the metal foil pattern 12a is formed. The metal foil pattern 12a includes the ground layer.

Next, as illustrated in FIG. 5A3, the adhesive layer 13 is stacked on the upper surface of the dielectric layer 11. Further, a protective film 14 is stacked on the adhesive layer 13. The thickness of the adhesive layer 13 is 25 µm, for example. The thickness of the protective film 14 is 15 µm, for example. In the present embodiment, a material used for the adhesive layer 13 can ensure the strength of adhesion to the liquid crystal polymer film, and has dielectric properties equal to or less than the dielectric properties of the dielectric layer 11. For example, a film made of polyethylene terephthalate (PET) is used as the protective film 14.

Note that the thickness of the protective film 14 defines the amount of protrusion of later-described conductive paste 16. In a case where the protective film 14 is too thick, the amount of protrusion of the conductive paste 16 is too great. For this reason, the adhesive layer 23 cannot absorb unevenness at a later-described stacking step. As a result, there is a probability that the flatness of the printed circuit board 2 is degraded. On the other hand, in a case where the protective film 14 is too thin, the amount of protrusion of the conductive paste 16 is too small. As a result, there is a probability that the reliability of connection between the conductive paste 16 and the metal foil pattern 17b cannot be sufficiently ensured. Thus, the thickness of the protective film 14 is preferably within a range of 15±10 µm.

An adhesive layer-equipped protective film (not shown) including the adhesive layer 13 applied to one surface of the protective film 14 may be used. In this case, the adhesive layer-equipped protective film is bonded to a dielectric layer 11 side of the one-side metal-clad laminate 10, and in this manner, the configuration illustrated in FIG. 5A3 is attained.

Next, as illustrated in FIG. 5B1, the protective film 14, the adhesive layer 13, and the dielectric layer 11 are removed by irradiation of a predetermined location of the protective film 14 with laser light. In this manner, a conductive hole H1 is formed. The metal foil pattern 12a is exposed at a bottom surface of the conductive hole H1. More specifically, desmear processing is performed after punching by irradiation with a laser pulse. In this manner, residual resin and the back surface treatment film (a Ni/Cr film or the like) of the metal foil pattern 12a at a boundary between the dielectric layer 11 and the metal foil pattern 12a are removed.

The diameter of the conductive hole H1 is φ50 µm to 200 µm, for example. Examples of a laser used for laser machining include an infrared laser such as a carbon dioxide gas laser and an UV-YAG laser. In the case of using the carbon dioxide gas laser, a beam diameter is adjusted to the diameter of the conductive hole H1. Examples of an applicable laser beam machine include a carbon dioxide gas laser beam machine (ML605GTXIII-5100U2) manufactured by Mitsubishi Electric Corporation. The beam diameter is adjusted to 150 µm with, e.g., a predetermined aperture, and therefore, a single location can be irradiated with five pulse shots such that a pulse width is 10 µSec and an energy per pulse is 5 mJ.

Next, as illustrated in FIG. 5B2, the conductive hole H1 is filled with the conductive paste 16. More specifically, by a printing method such as screen printing, the conductive hole H1 is filled with the conductive paste 16 by using the protective film 14 as a printing mask. The conductive paste 16 described herein is prepared in such a manner that metal particles are dispersed in a resin binder as thermosetting resin in the form of paste.

Note that for reducing entrance of an air void into the conductive hole H1 at the step of printing the conductive paste, the conductive paste 16 is preferably printed under vacuum environment. For example, a vacuum printing machine for screen printing is suitably used. Thus, even if the void is caused in the conductive hole H1 during printing of the conductive paste, such a void is crushed and eliminated by an atmospheric pressure upon venting to the atmospheric pressure.

Next, as illustrated in FIG. 5B3, the protective film 14 is detached from the adhesive layer 13. Accordingly, part of the conductive paste 16 with which the conductive hole H1 is filled protrudes from the adhesive layer 13.

Next, as illustrated in FIGS. 5C1 and 5C2, metal foil 17 is bonded onto the adhesive layer 13 (a laminate step). Metal foil (e.g., low-roughness copper foil or copper foil formed with no back surface treatment film) having a lower specific conductivity than the specific conductivity of the metal foil 12 is used as the metal foil 17. The thickness of the metal foil 17 is 12 µm, for example.

Details of the laminate step will be described. First, the metal foil 17 is placed on the adhesive layer 13 to contact the conductive paste 16 protruding from the adhesive layer 13. In a case where it is difficult to handle the metal foil 17 alone, the metal foil 17 detachably bonded to a resin film (a not-shown carrier) such as PET may be first placed on the adhesive layer 13. Thereafter, the carrier can be removed.

The metal foil 17 is patterned at a later step. Thus, it is not necessary to adjust the position of the metal foil 17 upon placement on the adhesive layer 13. Note that as necessary, e.g., a guide hole may be formed at the metal foil 17.

After the metal foil 17 has been placed on the adhesive layer 13 as described above, the one-side metal-clad laminate 10 (a laminated body) including the placed metal foil 17 is heated and pressurized using a vacuum press device or a vacuum laminator device. For example, the laminated body is heated to about 200° C., and is pressurized with a pressure of about several MPa. Note that a heating temperature is preferably set to a temperature (e.g., equal to or higher than 50° C.) sufficiently lower than a softening temperature of the liquid crystal polymer forming the dielectric layer 11.

In the case of using the vacuum press device, the laminated body is held under the above-described heating and pressurization conditions for about 30 minutes to 60 minutes. In this manner, thermal hardening of the adhesive layer 13 and thermal hardening of the binder resin of the conductive paste 16 are completed.

In the case of using the vacuum laminator device, heating and pressurization time is about several minutes. Note that at the end of such heating and pressurization, thermal hardening reaction is not completed yet. For this reason, postcure treatment is performed for the laminated body delivered from the vacuum laminator device to an oven device. In the postcure treatment, the laminated body is heated at a temperature around 200° C. for about 60 minutes, for example. In this manner, thermal hardening of the adhesive layer 13 and thermal hardening of the binder resin of the conductive paste 16 are completed.

In the case of using any of the vacuum press device and the vacuum laminator device, the metal particles contained in the conductive paste 16 are metal-bound to each other by heating at a predetermined temperature. In addition, some of the metal particles are metal-bound to the metal foil pattern 12a and the metal foil 17. In this manner, the filled via 16c for interlayer connection is formed as illustrated in FIG. 5C2. Further, by such heating, any of the thermal hardening reaction of the resin binder contained in the conductive paste 16 and the thermal hardening reaction of the adhesive layer 13 substantially ends.

Next, as illustrated in FIG. 5C3, the metal foil 17 on the adhesive layer 13 is patterned by a well-known fabrication method. In this manner, the metal foil patterns 17a forming the signal lines and the metal foil patterns 17b forming the ground wires are formed. Note that some of the metal foil patterns 17b serve as receiving lands of later-described conductive paste 26. By the steps performed so far, a wiring base material 100 is obtained.

Note that in the case of the printed circuit board configured such that the ground layer is provided only on one side of the signal line, surface treatment for a wiring layer (the signal lines, the ground wires) exposed to the outside, formation of a surface protective film, outline machining and the like are performed as necessary after the wiring base material 100 has been obtained, and in this manner, the printed circuit board is completed.

Next, production of another wiring base material 200 will be described.

First, as illustrated in FIG. 6A1, a one-side metal-clad laminate 20 having the dielectric layer 21 and metal foil 22 provided on one surface of the dielectric layer 21 is prepared. The dielectric layer 21 is, for example, a liquid crystal polymer film with a thickness of 100 µm. The metal foil 22 is, for example, copper foil with a thickness of 12 µm. Note that the metal foil 22 may be made of metal (silver, aluminum, or the like) other than copper.

Next, as illustrated in FIG. 6A2, the metal foil 22 of the one-side metal-clad laminate 20 is patterned by the well-known photofabrication method, and in this manner, the metal foil pattern 22a is formed. The metal foil pattern 22a includes the ground layer.

Next, as illustrated in FIG. 6A3, the adhesive layer 23 is stacked on the lower surface (a resin surface of the one-side metal-clad laminate 20) of the dielectric layer 21. Further, a protective film 24 made of, e.g., PET is stacked on the adhesive layer 23. The thickness of the adhesive layer 23 is 25 µm, for example. The thickness of the protective film 24 is 15 µm, for example. In the present embodiment, a material used for the adhesive layer 23 can ensure the strength of adhesion to the liquid crystal polymer film, and has dielectric properties equal to or less than the dielectric properties of the dielectric layer 21.

Note that the thickness of the protective film 24 defines the amount of protrusion of the later-described conductive paste 26. As in the case of the protective film 14, the thickness of the protective film 24 is preferably within a range of 15±10 µm.

An adhesive layer-equipped protective film (not shown) including the adhesive layer 23 applied to one surface of the protective film 24 may be used. In this case, the adhesive layer-equipped protective film is bonded to a dielectric layer 21 side of the one-side metal-clad laminate 20, and in this manner, the configuration illustrated in FIG. 6A3 is attained.

Next, as illustrated in FIG. 6B1, the protective film 24, the adhesive layer 23, and the dielectric layer 21 are removed by irradiation of a predetermined location of the protective film 24 with laser light. In this manner, a conductive hole H2 is formed. The metal foil pattern 22a is exposed at a bottom surface of the conductive hole H2. The diameter of the conductive hole H2 is φ150 µm to 200 µm, for example. This step is similar to the step of forming the conductive hole H1 as already described. Thus, detailed description will be omitted.

Next, as illustrated in FIG. 6B2, the conductive hole H2 is filled with the conductive paste 26. This step is similar to the step of filling the conductive hole H1 with the conductive paste 16 as already described. Thus, detailed description will be omitted.

Next, as illustrated in FIG. 6B3, the protective film 24 is detached from the adhesive layer 23. In this manner, the wiring base material 200 is obtained.

Two wiring base materials 100, 200 produced as described above are stacked on each other after position adjustment. Then, by heating and pressurization, the wiring base material 100 and the wiring base material 200 are integrated. In this manner, the printed circuit board 2 is obtained. Detailed steps are as follows.

Figure 7A:
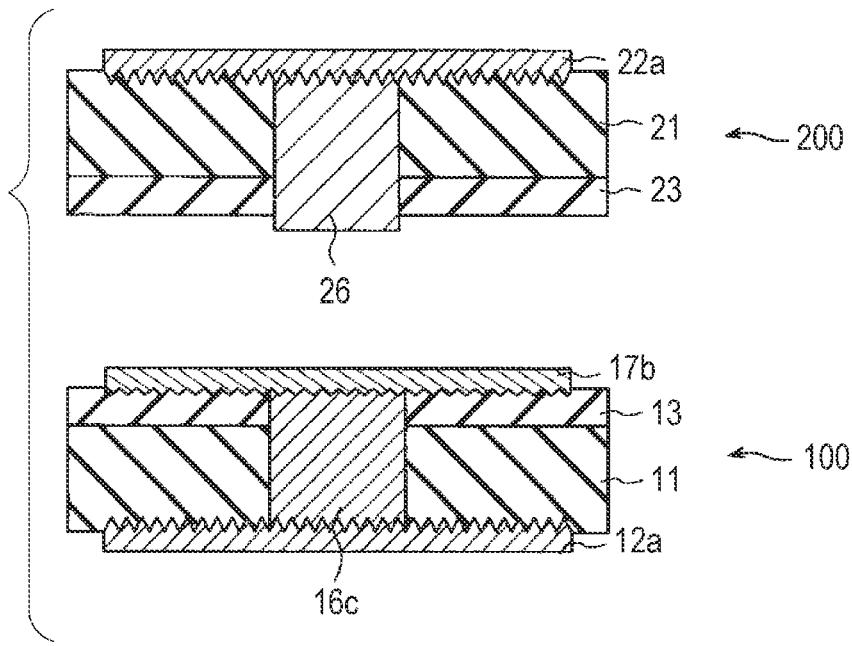
FIGS. 7A and 7B are sectional views for describing a stacking step for the printed circuit board according to the present embodiment.
Figure 7B:
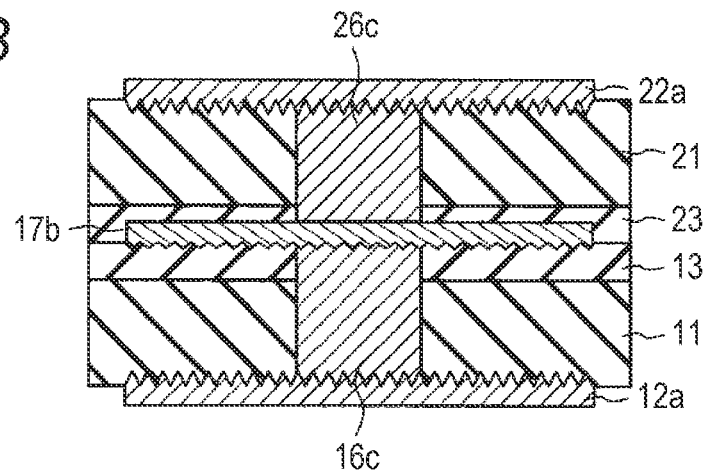

First, as illustrated in FIGS. 7A and 7B, the wiring base material 100 and the wiring base material 200 are stacked on each other such that the conductive paste 26 protruding from the adhesive layer 23 contacts the metal foil patterns 17b as the ground wires (the stacking step).

Thereafter, the wiring base material 100 and the wiring base material 200 stacked on each other are integrated by heating and pressurization (an integration step). By heating of this step, thermal hardening of binder resin of the conductive paste 26 is completed. This step is performed similarly to the step of heating and pressurizing the one-side metal-clad laminate 10 including the placed metal foil 17 as described above.

In the case of using any of the vacuum press device and the vacuum laminator device, metal particles contained in the conductive paste 26 are metal-bound to each other by heating at a predetermined temperature (a stacking process temperature). In addition, some of the metal particles are metal-bound to the metal foil pattern 22a and the metal foil patterns 17b. In this manner, the filled via 26c for interlayer connection is formed as illustrated in FIG. 7B. Further, by such heating, any of the thermal hardening reaction of the resin binder contained in the conductive paste 26 and the thermal hardening reaction of the adhesive layer 23 substantially ends.

Note that at the integration step, the metal particles contained in the conductive paste 16, 26 are metal-bound to each other by heating at the stacking process temperature (e.g., about 200° C.). For this process, the melting point of the metal particle is preferably equal to or lower than the stacking process temperature. Examples of such low-melting-point metal include In, SnIn, and SnBi. Thus, the conductive paste 16, 26 to be used preferably contains metal particles made of any of these low-melting-point metals.

In a case where the metal foil 12, 17, 22 is copper foil, the conductive paste 16, 26 to be used preferably contains metal particles made of Sn, Zn, Al, Ag, Ni, Cu, or alloy thereof. Thus, by heating at the stacking process temperature (e.g., about 200° C.), the metal particles contained in the conductive paste 16, 26 form an alloy layer, and are metal-bound to the copper foil.

After the integration step, the surface treatment for the wiring layer exposed to the outside, formation of the surface protective film, outline machining and the like are performed as necessary.

The printed circuit board 2 is obtained through the above-described steps. According to the method for manufacturing the printed circuit board according to the present embodiment, the strength of adhesion to the dielectric layer 11 is weak, but the metal foil with a high specific conductivity can form the metal foil patterns (the signal lines) 17a. Thus, the printed circuit board is manufactured so that the loss of transmission of the high-frequency signal can be reduced.

Further, according to the method for manufacturing the printed circuit board according to the present embodiment, the printed circuit board having the three-layer stripline structure can be manufactured from two one-side metal-clad laminates 10, 20. Thus, as compared to the method of the comparative example using three one-side metal-clad laminates, the printed circuit board can be easily manufactured. As a result, a manufacturing efficiency can be improved.

Further, according to the method for manufacturing the printed circuit board according to the present embodiment, the printed circuit board can be manufactured using, as a starting material, the same one-side metal-clad laminates including the dielectric layers with the same thickness. The printed circuit board has the substantially symmetrical structure in the thickness direction. That is, by a relatively-easy method, the printed circuit board with excellent bending properties can be manufactured.

Note that in the above-described method for manufacturing the printed circuit board 2, e.g., the patterns of the ground layers are formed by patterning of the metal foil 12 and the metal foil 22 before the wiring base material 100 and the wiring base material 200 are stacked on each other and are integrated. Note that the present embodiment is not limited to such a method. That is, e.g., the patterns of the ground layers may be formed by patterning of the metal foil 12 and the metal foil 22 after the integration step. In this manner, the metal foil 12, 22 can be patterned with the position thereof being adjusted with respect to the positions of the metal foil patterns 17a, 17b. This method is also effective even for the case of a great shrinkage variation in the dimensions of the wiring base materials 100, 200 at the integration step.

In the case of patterning the metal foil 12, 22 after the integration step, the metal foil 12 and the metal foil 22 may be simultaneously patterned by simultaneous double-side exposure. In this manner, the positions of the metal foil pattern 12a and the metal foil pattern 22a can be adjusted with a higher accuracy than position adjustment accuracy (stacking accuracy) when the wiring base material 100 and the wiring base material 200 are stacked on each other. Specifically, a position adjustment accuracy within ±10 μm can be relatively easily attained.

<Verification Results>

Results of measurement of the transmission loss in the printed circuit board 2 according to the embodiment and the printed circuit board according to the above-described comparative example will be described with reference to Table 1. The transmission loss was measured for two first and second embodiments and two first and second comparative examples. Note that the length of the signal line of any of the printed circuit boards targeted for measurement is 100 mm. The width of the signal line is 0.15 mm in any case.

The type of copper foil forming the signal line is different between the first embodiment and the second embodiment. In the first embodiment, copper foil of which Rzjis is 0.1 μm was used. In the second embodiment, copper foil of which Rzjis is 1.0 μm was used. No back surface treatment film was provided on any of these types of copper foil (i.e., no magnetic metal such as nickel was contained). NC-WS foil manufactured by Furukawa Electric Co., Ltd. was used as the copper foil B of the first embodiment. T49-DS-HD2 foil manufactured by Fukuda Metal Foil and Powder Co., Ltd. was used as the copper foil C of the second embodiment.

The same copper foil A was, as the copper foil forming the ground layer, used between the first embodiment and the second embodiment. TP4S foil (Rzjis=1.3 μm) manufactured by Fukuda Metal Foil and Powder Co., Ltd. was used as the copper foil A.

On the other hand, in the first comparative example, the above-described copper foil A was used for any of the outer layer (GND) and the inner layer (the signal lines). In the second comparative example, copper foil D (F2WS foil manufactured by Furukawa Electric Co., Ltd., Rzjis=1.8 μm) having a higher roughness than that of the copper foil A was used for any of the outer layer (GND) and the inner layer (the signal lines).

Back surface treatment films containing nickel were formed on the copper foil A and the copper foil D. No back surface treatment films were formed on the copper foil B and the copper foil C.

In any of the first and second embodiments and the first and second comparative examples, the same material was used for the dielectric layers 11, 21, and the same material was used for the adhesive layers 13, 23. Specifically, a liquid crystal polymer film (RF-7005, a thickness of 100 μm) manufactured by Panasonic Corporation was used for the dielectric layers 11, 21. SAFY (a thickness of 25 μm) manufactured by Nikkan Industries Co., Ltd. was used for the adhesive layers 13, 23.

TABLE 1

| | Wiring Layer | First Embodiment | Second Embodiment | First Comparative Example | Second Comparative Example |
| --- | --- | --- | --- | --- | --- |
| Structure | First Layer (GND) | Copper Foil A Rzjis: 1.3 μm | Copper Foil A | Copper Foil A | Copper Foil D Rzjis: 1.8 μm |

TABLE 1-continued

| | Wiring Layer | First Embodiment | Second Embodiment | First Comparative Example | Second Comparative Example |
|---|---|---|---|---|---|
| | Second Layer (Signal Lines) | Copper Foil B Rzjis: 0.1 μm (without Ni) | Copper Foil C Rzjis: 1.0 μm (without Ni) | Copper Foil A | Copper Foil D |
| | Third Layer (GND) | Copper Foil A | Copper Foil A | Copper Foil A | Copper Foil D |
| Transmission Loss | dB/100 mm@5 GHz | −1.19 | −1.19 | −1.20 | −1.60 |
| | dB/100 mm@10 GHz | −1.77 | −1.82 | −1.83 | −2.73 |
| | dB/100 mm@20 GHz | −2.77 | −2.86 | −3.06 | −4.87 |
| | dB/100 mm@50 GHz | −5.79 | −6.29 | −6.89 | — |

As seen from Table 1, in the first embodiment in which the copper foil B is applied to the signal lines and the second embodiment in which the copper foil C is applied to the signal lines, the transmission loss is significantly smaller than those of the first and second comparative examples in a high-frequency range of equal to or higher than 20 GHz focused in the field of 5G communication and a millimeter-wave radar. On the other hand, in a case where copper foil with a high roughness is applied to the signal lines as in the copper foil D of the second comparative example, the transmission loss is great at 5 GHz.

As described above, in the printed circuit board according to the present embodiment, the metal foil patterns 17a adhere to the dielectric layer 11 through the adhesive layer 13. Thus, even in a case where an insulating resin film with less adhesion strength, such as the liquid crystal polymer, is used as the dielectric layer 11, metal foil having a high specific conductivity, such as low-roughness copper foil or copper foil formed with no back surface treatment film, can be used as the signal line important for transmission of the high-frequency signal. Thus, the loss of transmission of the high-frequency signal can be reduced.

Further, the printed circuit board according to the present embodiment has the substantially symmetrical structure with respect to the metal foil pattern 17a as the signal line in the thickness direction. Thus, even when the printed circuit board 2 is bent for assembling the high-frequency signal transmission component 1 into, e.g., the housing of the smartphone or the bent printed circuit board 2 is placed in the housing, the failure such as breaking of the signal line can be prevented. In addition, favorable signal propagation properties can be maintained.

<Method for Manufacturing Printed Circuit Board (Variation)>

Figure 8A:
FIGS. 8A, 8B, 8C, and 8D are sectional views for describing steps in the method for manufacturing a wiring base material of a printed circuit board according to a variation of the present embodiment.

Next, one example of the method for manufacturing a printed circuit board according to a variation will be described with reference to FIGS. 8A to 10C2. In the printed circuit board according to the present variation, the interlayer connection portion (the ground connection portion) includes a metal plating layer. Note that FIGS. 8A to 10C2 illustrate the region S of FIG. 4 around the ground wire. Moreover, in each figure, the same reference numerals are used to represent configurations similar to those of the embodiment.

Hereinafter, the present variation will be described. Contents overlapping with those of the embodiment will be omitted as necessary.

First, as illustrated in FIG. 8A, the one-side metal-clad laminate 10 including the dielectric layer 11 and the metal foil 12 provided on one surface of the dielectric layer 11 is prepared.

Figure 8B:
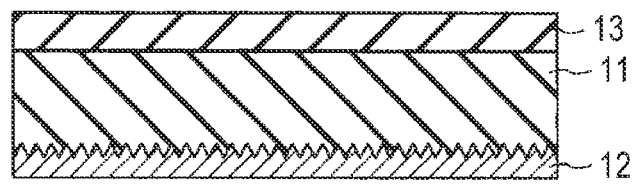

Next, as illustrated in FIG. 8B, the adhesive layer 13 is stacked on the upper surface (a resin surface of the one-side metal-clad laminate 10) of the dielectric layer 11.

Figure 8C:
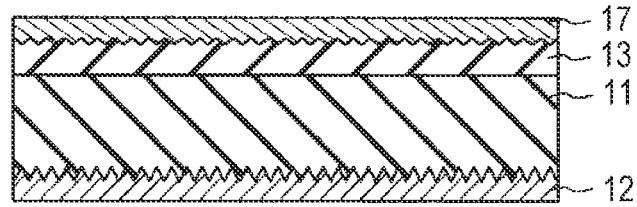

Next, as illustrated in FIG. 8C, the metal foil 17 is bonded onto the adhesive layer 13. Specifically, the metal foil 17 is first placed on the adhesive layer 13. Thereafter, the one-side metal-clad laminate 10 having the placed metal foil 17 is heated and pressurized using the vacuum press device or the vacuum laminator device. The heating and pressurization conditions are similar to those in the case of the above-described embodiment. In this manner, thermal hardening of the adhesive layer 13 is completed.

Figure 8D:
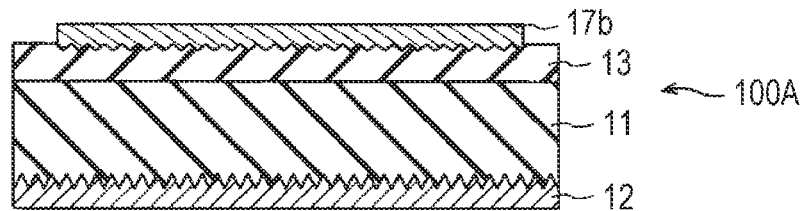

Next, as illustrated in FIG. 8D, the metal foil 17 on the adhesive layer 13 is patterned by the well-known fabrication method, and in this manner, the metal foil patterns 17a forming the signal lines and the metal foil patterns 17b forming the ground wires are formed. By the steps performed so far, a wiring base material 100A is obtained.

Next, production of another wiring base material 200A will be described.

Figure 9A:
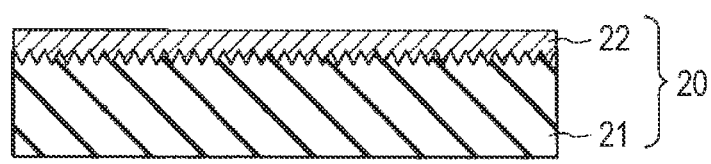
FIGS. 9A and 9B are sectional views for describing steps in the method for manufacturing a wiring base material of the printed circuit board according to the variation of the present embodiment.

First, as illustrated in FIG. 9A, the one-side metal-clad laminate 20 having the dielectric layer 21 and the metal foil 22 provided on one surface of the dielectric layer 21 is prepared.

Figure 9B:
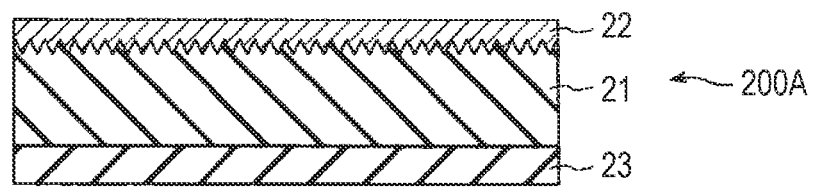

Next, as illustrated in FIG. 9B, the adhesive layer 23 is stacked on the lower surface (the resin surface of the one-side metal-clad laminate 20) of the dielectric layer 21. By the steps performed so far, the wiring base material 200A is obtained.

Next, as illustrated in FIGS. 10A1 and 10A2, the positions of the wiring base material 100A and the wiring base material 200A are adjusted such that the adhesive layer 13 and the adhesive layer 23 face each other, and the wiring base material 100A and the wiring base material 200A are stacked on each other (the stacking step). Thereafter, the wiring base material 100A and the wiring base material 200A stacked on each other are integrated by heating and pressurization (the integration step). In this manner, the adhesive layers 13, 23 are hardened.

Next, as illustrated in FIG. 10B1, the metal foil 12 is patterned by a well-known fabrication method, and in this manner, a conformal mask M1 is formed. Further, the metal foil 22 is patterned, and in this manner, a conformal mask M2 is formed.

Next, as illustrated in FIG. 10B2, the dielectric layer 11 and the adhesive layer 13 are removed by irradiation of the conformal mask M1 with laser light. In this manner, a conductive hole H1A is formed. The metal foil pattern 17b as the ground wire is exposed at a bottom surface of the conductive hole H1A. Similarly, the dielectric layer 21 and the adhesive layer 23 are removed by irradiation of the conformal mask M2 with laser light. In this manner, a conductive hole H2A is formed. The metal foil pattern 17b as the ground wire is exposed at a bottom surface of the conductive hole H2A.

Note that at this step, the above-described carbon dioxide gas laser beam machine is used, for example. More specifically, the desmear processing is performed after punching by irradiation with the laser pulse. In this manner, residual resin at a boundary between the adhesive layer 13 and the metal foil pattern 17b is removed. In the case of using the metal foil 17 formed with the back surface treatment film, the back surface treatment film of the metal foil pattern 17b is removed by the desmear processing. In this manner, the conductive hole H1A is formed. The same also applies to the conductive hole H2A.

Next, as illustrated in FIG. 10C1, a metal plating layer 31 is formed inside the conductive hole H1A, and electrically connects the metal foil pattern 17b and the metal foil 12. Similarly, a metal plating layer 32 is formed inside the conductive hole H2A, and electrically connects the metal foil pattern 17b and the metal foil 22. The metal plating layers 31, 32 are, for example, formed by electrolytic copper plating treatment after conduction treatment such as chemical plating. Note that the metal plating layer 31 and the metal plating layer 32 may be simultaneously formed by double-side plating. As illustrated in FIG. 10C1, the metal plating layers 31, 32 are formed not only on inner walls of the conductive holes H1A, H2A but also the metal foil 12, 22 of the outer layers.

Next, as illustrated in FIG. 10C2, a multilayer film including the metal foil 12 and the metal plating layer 31 is patterned by the photofabrication method, and in this manner, a multilayer film including the metal foil pattern 12a and a metal plating pattern 31a is formed including the ground layer. Similarly, a multilayer film including the metal foil 22 and the metal plating layer 32 is patterned, and in this manner, a multilayer film including the metal foil pattern 22a and a metal plating pattern 32a is formed including the ground layer.

Thereafter, the surface treatment for the wiring layer exposed to the outside, formation of the surface protective film, outline machining and the like are performed as necessary.

The printed circuit board according to the variation is obtained through the above-described steps.

Note that even in a case where the ground connection portion is the metal plating layer as in the variation, the printed circuit board configured such that the ground layer is provided only on one side of the signal line can be produced. In this case, the metal foil 12 is patterned after the wiring base material 100A (FIG. 8D) has been obtained, and in this manner, the conformal mask M1 is formed. Then, the dielectric layer 11 and the adhesive layer 13 are removed by irradiation of the conformal mask M1 with laser light. In this manner, the conductive hole H1A is formed. The metal foil pattern 17b as the ground wire is exposed at the bottom surface of the conductive hole H1A. Thereafter, the metal plating layer 31 is formed inside the conductive hole H1A, and electrically connects the metal foil pattern 17b and the metal foil 12. In this manner, the printed circuit board including the ground layer provided only on one side of the signal line and interlayer-connected by the metal plating layer can be produced.

The printed circuit board described above is not limited to application to the above-described high-frequency signal transmission component 1. Needless to say, the printed circuit board can be also applied to, e.g., other wiring components and boards for transmitting high-frequency signals.

Those skilled in the art can arrive at additional advantageous effects and various modifications of the present embodiment based on description above. The present embodiment is not limited to the above-described embodiment, and also includes additional advantageous effects and various modifications as described above. Various additions, changes, and partial omissions of the components of the embodiment can be made without departing from the conceptual idea and gist of the present embodiment derived from the subject matter of the invention and equivalents thereof as defined in the claims.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A printed circuit board comprising:
   a first dielectric layer including a first principal surface and a second principal surface on a side opposite to the first principal surface;
   a first adhesive layer formed on the first principal surface;
   a first metal foil pattern formed on the first adhesive layer and forming a signal line; and
   a second metal foil pattern formed on the second principal surface and forming a ground layer,
   wherein the first metal foil pattern has a higher specific conductivity than a specific conductivity of the second metal foil pattern.

2. The printed circuit board according to claim 1, wherein the first dielectric layer is made of liquid crystal polymer.

3. The printed circuit board according to claim 1, further comprising:
   a second dielectric layer including a third principal surface and a fourth principal surface on a side opposite to the third principal surface;
   a second adhesive layer formed on the fourth principal surface and bonded to the first adhesive layer; and
   a third metal foil pattern formed on the third principal surface and forming a ground layer,
   wherein the first metal foil pattern has a higher specific conductivity than a specific conductivity of the third metal foil pattern.

4. The printed circuit board according to claim 3, wherein the second adhesive layer is thicker than the first metal foil pattern, and
   the first metal foil pattern is embedded in an adhesive layer including the first adhesive layer and the second adhesive layer.

5. The printed circuit board according to claim 4, wherein the first dielectric layer and the second dielectric layer have an identical thickness, and
   the first adhesive layer and the second adhesive layer have an identical thickness.

6. The printed circuit board according to claim 4, wherein the first dielectric layer and the second dielectric layer have an identical thickness, and the first adhesive layer is thinner than the second adhesive layer by a thickness of the first metal foil pattern.

7. The printed circuit board according to claim 3, wherein the second dielectric layer is made of liquid crystal polymer.

8. The printed circuit board according to claim 3, wherein the first metal foil pattern has a lower surface roughness and/or contains a smaller magnetic metal amount than those of the second metal foil pattern and the third metal foil pattern.

9. The printed circuit board according to claim 8, wherein a ten-point average roughness of the first metal foil pattern is equal to or lower than 1.0 μm.

10. The printed circuit board according to claim 3, further comprising:
a fourth metal foil pattern formed on the first adhesive layer, extending in parallel with the signal line of the first metal foil pattern with a predetermined spacing from the signal line of the first metal foil pattern, and forming a ground wire;
a first ground connection portion electrically connecting the second metal foil pattern and the fourth metal foil pattern; and
a second ground connection portion electrically connecting the third metal foil pattern and the fourth metal foil pattern.

11. The printed circuit board according to claim 10, wherein
the first ground connection portion includes a through-hole penetrating the first dielectric layer in a thickness direction and filled with hardened conductive paste, and
the second ground connection portion includes a through-hole penetrating the second dielectric layer in the thickness direction and filled with hardened conductive paste.

12. The printed circuit board according to claim 10, wherein
the first ground connection portion includes a metal plating layer formed in a through-hole penetrating the first dielectric layer in a thickness direction, and
the second ground connection portion includes a metal plating layer formed in a through-hole penetrating the second dielectric layer in the thickness direction.

13. A printed circuit board comprising:
a first dielectric layer including a first principal surface and a second principal surface on a side opposite to the first principal surface;
a first adhesive layer formed on the first principal surface;
a first metal foil pattern formed on the first adhesive layer and forming a signal line;
a second metal foil pattern formed on the second principal surface and forming a ground layer;
a second dielectric layer including a third principal surface and a fourth principal surface on a side opposite to the third principal surface;
a second adhesive layer formed on the fourth principal surface and bonded to the first adhesive layer; and
a third metal foil pattern formed on the third principal surface and forming a ground layer,
wherein the second adhesive layer is thicker than the first metal foil pattern, and
the first metal foil pattern is embedded in an adhesive layer including the first adhesive layer and the second adhesive layer.

\* \* \* \* \*